United States Patent
Chiang et al.

(10) Patent No.: US 11,482,469 B2
(45) Date of Patent: Oct. 25, 2022

(54) TRANSISTOR HEAT DISSIPATION MODULE AND ASSEMBLY METHOD THEREOF

(71) Applicants: LITE-ON ELECTRONICS (GUANGZHOU) LIMITED, Guangzhou (CN); Lite-On Technology Corporation, Taipei (TW)

(72) Inventors: Cheng-Chung Chiang, Taipei (TW); Yu-Po Chen, Taipei (TW); Ping-Ho Chu, Taipei (TW); Chih-Chun Yu, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 16/852,554

(22) Filed: Apr. 20, 2020

(65) Prior Publication Data

US 2021/0272876 A1 Sep. 2, 2021

(30) Foreign Application Priority Data

Feb. 27, 2020 (CN) .......................... 202010124713.4

(51) Int. Cl.
*H01L 23/40* (2006.01)
*H01L 21/48* (2006.01)
*H01L 23/367* (2006.01)

(52) U.S. Cl.
CPC ...... *H01L 23/4093* (2013.01); *H01L 21/4882* (2013.01); *H01L 23/367* (2013.01); *H01L 23/40* (2013.01)

(58) Field of Classification Search
CPC ............. H01L 23/4093; H01L 21/4882; H01L 23/367; H01L 23/40

(Continued)

(56) References Cited

U.S. PATENT DOCUMENTS

| 5,327,324 A | * | 7/1994 | Roth | ................... H05K 7/20854 |
| | | | | 174/16.3 |
| 2007/0096278 A1 | * | 5/2007 | Nakatsu | ................ H01L 25/072 |
| | | | | 257/678 |

(Continued)

FOREIGN PATENT DOCUMENTS

| CN | 2689334 | 3/2005 |
| TW | 372120 | 10/1999 |

OTHER PUBLICATIONS

"Office Action of Taiwan Counterpart Application", dated Mar. 8, 2021, p. 1-p. 4.

(Continued)

*Primary Examiner* — David Vu
*Assistant Examiner* — Brandon C Fox
(74) *Attorney, Agent, or Firm* — JCIPRNET

(57) ABSTRACT

A transistor heat dissipation module is adapted for at least one transistor. The transistor heat dissipation module includes a heat dissipation member and an elastic member. The heat dissipation member includes a first wall and a second wall opposite to each other and a first connecting member connected to the first wall and the second wall. An accommodating space is formed between the first wall and the second wall. The transistor is disposed in the accommodating space. The elastic member is disposed in the accommodating space and is located between the at least one transistor and the first wall to press the at least one transistor against the second wall. An assembly method of a transistor heat dissipation module is further provided.

12 Claims, 10 Drawing Sheets

(58) Field of Classification Search
USPC .......................................................... 257/719
See application file for complete search history.

(56) References Cited

U.S. PATENT DOCUMENTS

| | | | |
|---|---|---|---|
| 2008/0218974 A1* | 9/2008 | Bartley | H01L 25/0657 |
| | | | 361/709 |
| 2011/0031864 A1* | 2/2011 | Rebergen | F21V 29/70 |
| | | | 361/720 |
| 2013/0062751 A1 | 3/2013 | Takagi et al. | |
| 2013/0075932 A1* | 3/2013 | Schwarzer | H01L 23/5226 |
| | | | 257/774 |
| 2015/0130045 A1* | 5/2015 | Tseng | H01L 24/83 |
| | | | 438/122 |
| 2015/0305169 A1 | 10/2015 | Wakana et al. | |
| 2017/0069562 A1* | 3/2017 | Ide | H01L 23/3736 |
| 2017/0164518 A1* | 6/2017 | Morgan | G02B 6/43 |
| 2020/0120830 A1* | 4/2020 | Song | H02M 7/003 |

OTHER PUBLICATIONS

"Office Action of China Counterpart Application", dated Jun. 6, 2022, p. 1-p. 9.

\* cited by examiner

TRANSISTOR HEAT DISSIPATION MODULE AND ASSEMBLY METHOD THEREOF

CROSS-REFERENCE TO RELATED APPLICATION

This application claims the priority benefit of Chinese patent application serial no. 202010124713.4, filed on Feb. 27, 2020. The entirety of the above-mentioned patent application is hereby incorporated by reference herein and made a part of this specification.

BACKGROUND

Technical Field

The disclosure relates to a heat dissipation module and an assembly method thereof, and in particular, to a transistor heat dissipation module and an assembly method thereof.

Description of Related Art

Transistors generate heat in operation, so a manufacturer arranges a heat dissipation member to dissipate heat and to prevent failure caused by overheating. However, shapes of transistors are all different. As such, heat dissipation members need to be designed to have corresponding shapes by a manufacturer. Further, corresponding assembly jigs are required by these heat dissipation members. Consequently, respective assembly manners and processes are needed, and considerable costs are therefore required.

SUMMARY

The disclosure provides a transistor heat dissipation module adapted for different transistors.

The disclosure provides an assembly method of a transistor heat dissipation module configured for assembling the above transistor heat dissipation module.

A transistor heat dissipation module of the disclosure is adapted for at least one transistor. The transistor heat dissipation module includes a heat dissipation member and an elastic member. The heat dissipation member includes a first wall and a second wall opposite to each other and a first connecting member connected to the first wall and the second wall. An accommodating space is formed between the first wall and the second wall. The transistor is disposed in the accommodating space. The elastic member is disposed in the accommodating space and is located between the at least one transistor and the first wall to press the at least one transistor against the second wall.

In an embodiment of the disclosure, the heat dissipation member further includes a second connecting member connected to the first wall and the second wall and opposite to the first connecting member, and the first wall, the second wall, the first connecting member, and the second connecting member surround and define the accommodating space together.

In an embodiment of the disclosure, the first connecting member includes an inner wall surface, the inner wall surface is in contact with the at least one transistor, and the first connecting member includes a concave portion close to the second wall and recessed in the inner wall surface to be isolated from the at least one transistor.

In an embodiment of the disclosure, the heat dissipation member further includes a bottom locating column adapted to be inserted into a locating hole of a circuit board.

In an embodiment of the disclosure, the transistor heat dissipation module further includes an insulating layer disposed on the second wall and facing the at least one transistor, and the at least one transistor is in contact with the insulating layer.

In an embodiment of the disclosure, the second wall is insulated, and the at least one transistor is in contact with the second wall.

In an embodiment of the disclosure, the first wall includes at least one through hole corresponding to the at least one transistor.

In an embodiment of the disclosure, the elastic member includes a first plate body and a second plate body connected at a bottom, so that the elastic member is V-shaped or U-shaped, and the bottom of the elastic member includes a notch.

In an embodiment of the disclosure, the elastic member further includes a first stopping portion connected to the first plate body and a second stopping portion connected to the second plate body, the first stopping portion is in contact with a top of the first wall, and the second stopping portion is in contact with a top of the at least one transistor.

In an embodiment of the disclosure, the at least one transistor includes two transistors, and the second plate body faces the two transistors and includes a protrusion part extending between the two transistors.

An assembly method of a transistor heat dissipation module of the disclosure includes the following steps. A transistor is located. A heat dissipation member is located to at least partially surround the transistor. The heat dissipation member includes a first wall and a second wall opposite to each other and a first connecting member connected to the first wall and the second wall. An accommodating space is formed between the first wall and the second wall, and the transistor is located in the accommodating space of the heat dissipation member. An elastic member is arranged, and the elastic member is arranged in the accommodating space and is located between the transistor and the first wall to make the transistor abut against the second wall.

In an embodiment of the disclosure, the assembly method of the transistor heat dissipation module further includes the following step. An assembly jig is provided. The assembly jig includes a first locating hole and a second locating hole, the transistor is located in the first locating hole, and the heat dissipation member is located in the second locating hole.

In an embodiment of the disclosure, the first wall includes a through hole corresponding to the transistor, the assembly jig includes a telescopic rod located in the through hole. After the transistor and the heat dissipation member are located, the telescopic rod extends in the through hole to push the transistor to the second wall to form a space between the transistor and the first wall. In the step of arranging the elastic member, the telescopic rod retracts to leave away from the through hole.

In an embodiment of the disclosure, the elastic member includes a first stopping portion and a second stopping portion. In the step of arranging the elastic member, the elastic member is inserted into the accommodating space until the first stopping portion is in contact with a top of the first wall and the second stopping portion is in contact with a top of the transistor.

Based on the above, in the transistor heat dissipation module of the disclosure, the transistor and the elastic member may be accommodated in the accommodating space of the heat dissipation member, and the elastic member may press the transistor against the second wall of the heat dissipation member. In this way, heat emitted by the transistor can be conducted to the heat dissipation member. Since the elastic member is flexible, even if sizes of transistors are different, transistors may contact with the heat dissipation member by pressing of the elastic member, and that the heat dissipation effect is achieved. Therefore, the transistor heat dissipation module of the disclosure may be applied to transistors in different sizes. In addition, the transistor heat dissipation module is suitable for different types of transistors. In the related art, various heat dissipation members are needed and therefore different assembly processes are required. The transistor heat dissipation module of the present embodiment and different transistors may adopt a single assembly manner. In this way, costs are significantly saved, and a defective rate arising from operational errors is also lowered.

DESCRIPTION OF THE EMBODIMENTS

Figure 1:
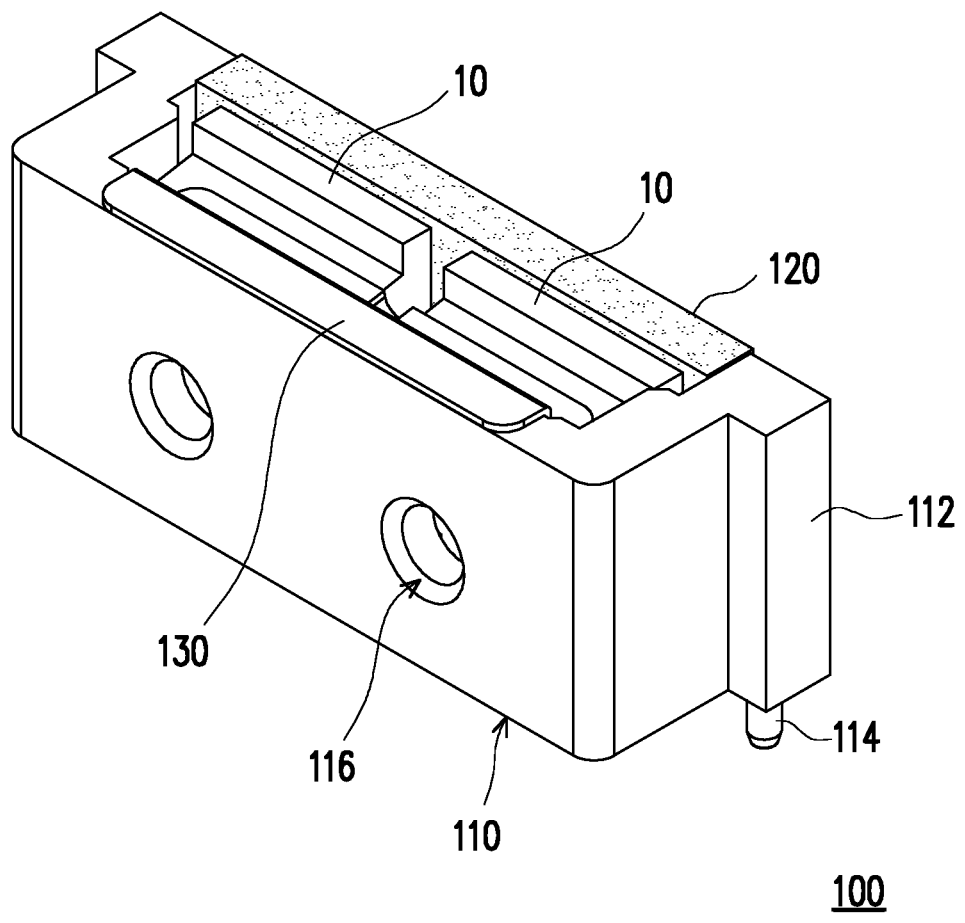
FIG. 1 is a schematic view of a transistor heat dissipation module and a transistor according to an embodiment of the disclosure.
Figure 2:
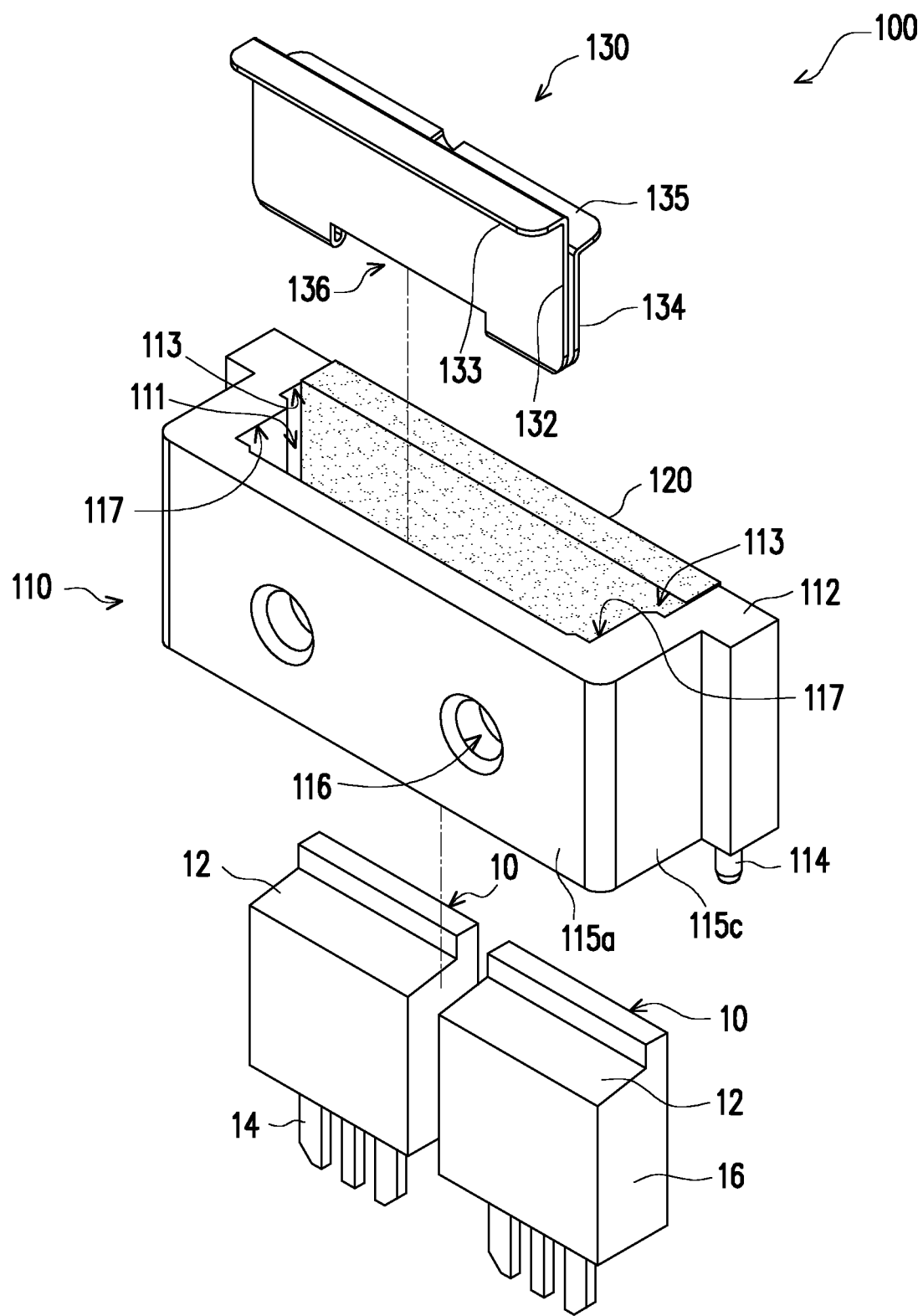
FIG. 2 is a schematic exploded view of FIG. 1.
Figure 3:
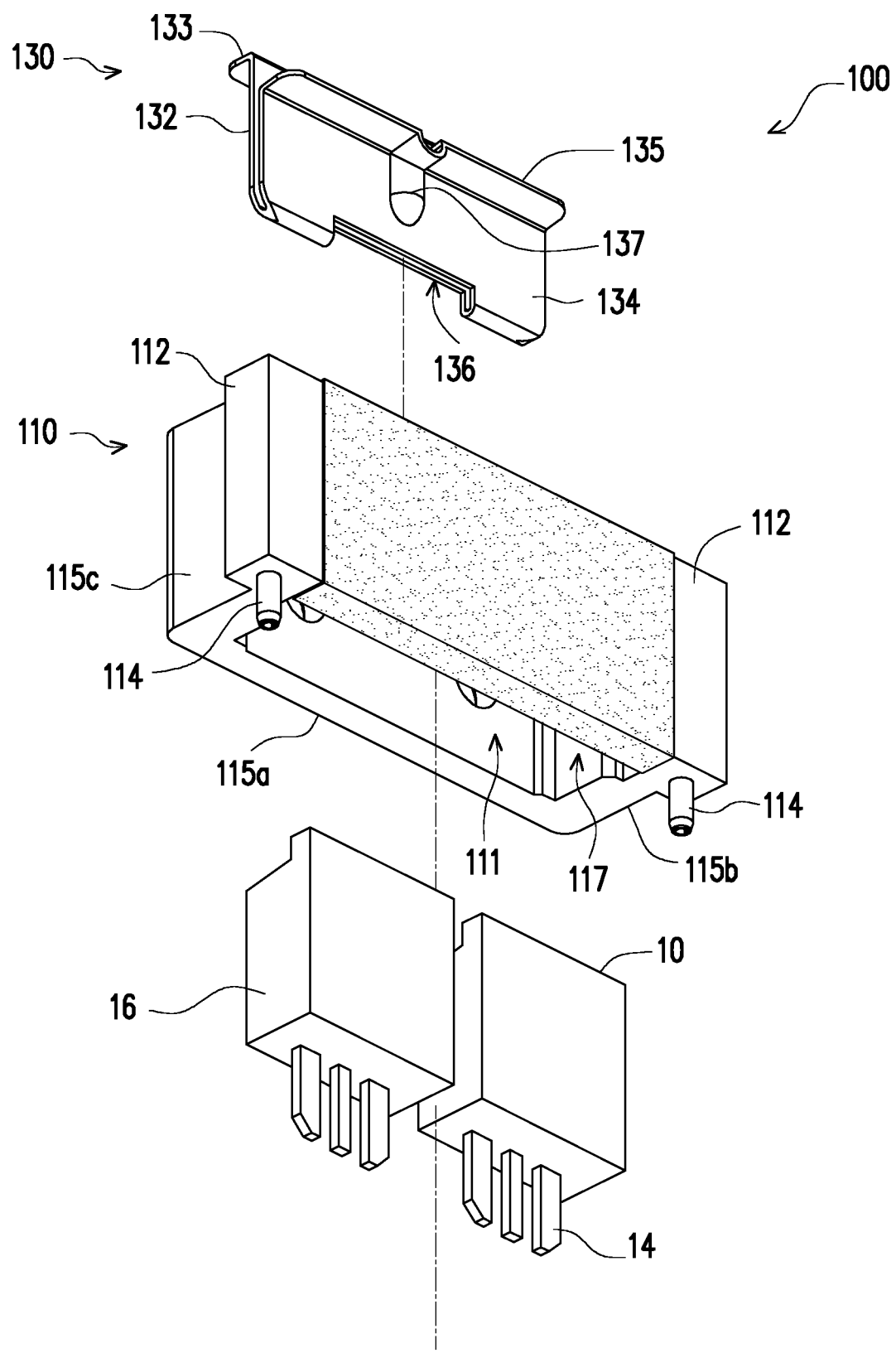
FIG. 3 is a schematic view of FIG. 2 from another angle of view.
Figure 4:
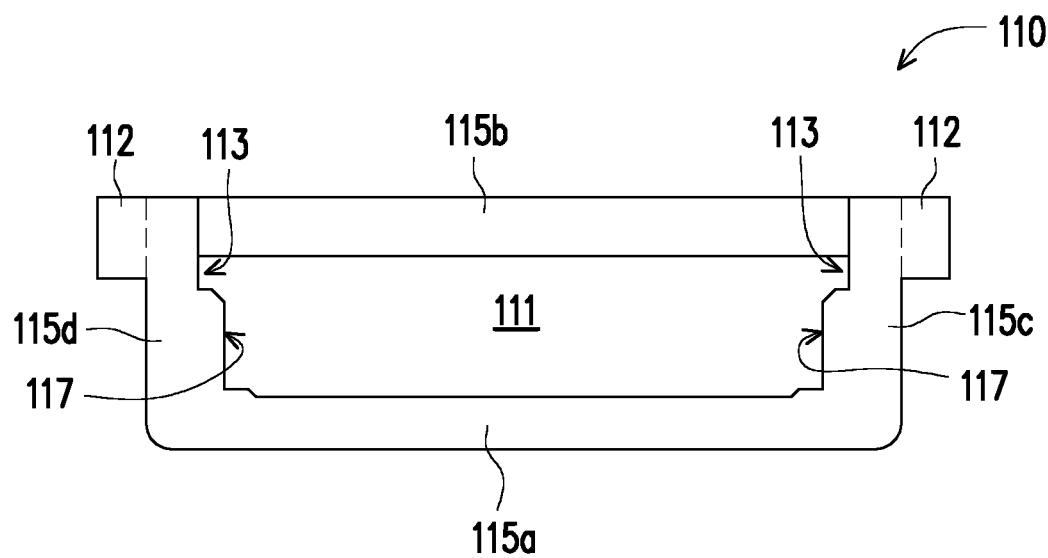
FIG. 4 is a schematic top view of a heat dissipation member of the transistor heat dissipation module in FIG. 1.

FIG. 1 is a schematic view of a transistor heat dissipation module and a transistor according to an embodiment of the disclosure. FIG. 2 is a schematic exploded view of FIG. 1. FIG. 3 is a schematic view of FIG. 2 from another angle of view. FIG. 4 is a schematic top view of a heat dissipation member of the transistor heat dissipation module in FIG. 1. Referring to FIG. 1 to FIG. 4, a transistor heat dissipation module 100 of the present embodiment is adapted for at least one transistor 10. In the present embodiment, a number of the transistors 10 is, for example, two, but is not limited thereto. The transistor heat dissipation module 100 includes a heat dissipation member 110 and an elastic member 130.

As shown in FIG. 4, in the present embodiment, the heat dissipation member 110 includes a first wall 115a and a second wall 115b opposite to each other and a first connecting member 115c connected to both the first wall 115a and the second wall 115b. An accommodating space 111 is formed between the first wall 115a and the second wall 115b. In addition, in the present embodiment, the heat dissipation member 110 further includes a second connecting member 115d connected to the first wall 115a and the second wall 115b and opposite to the first connecting member 115c. That is, in the present embodiment, the first wall 115a, the second wall 115b, the first connecting member 115c, and the second connecting member 115d surround and define the accommodating space 111 together.

The first connecting member 115c and the second connecting member 115d are, for example, a two-wall structure integrally formed with the first wall 115a and the second wall 115b. That is, the heat dissipation member 110 may be integrally constructed by four walls so that a heat dissipation area may be adaptively increased, but the heat dissipation member 110 is not limited thereto.

In addition, a material of the heat dissipation member 110 may be metal, for example, an aluminium extrusion material, but is not limited thereto, as long as the material exhibits high thermal conductivity. That is, the first wall 115a, the second wall 115b, the first connecting member 115c, and the second connecting member 115d may be electrically and thermally conductive as the metal material or other materials featuring in high thermal conductivity. In other embodiments, the first connecting member 115c and the second connecting member 115d may also be a structure used only for securing a relative position between the first wall 115a and the second wall 115b. In addition, in other embodiments, the second connecting member 115d may also be omitted.

In the present embodiment, the transistors 10 are disposed in the accommodating space 111. To enable heat emitted by the transistors 10 to be effectively conducted to the heat dissipation member 110, the elastic member 130 is disposed in the accommodating space 111 and is located between the transistors 10 and the first wall 115a. In the present embodiment, the elastic member 130 includes a first plate body 132 and a second plate body 134 connected at a bottom, so that the elastic member 130 is V-shaped or U-shaped. An upper half of the first plate body 132 and an upper half of the second plate body 134 may move and restore relatively.

In the present embodiment, the bottom of the elastic member 130 includes a notch 136, so that an elastic coefficient may be adjusted, or a force required for deforming the elastic member 130 may be adjusted. For example, if an elastic member 130 with a high elastic coefficient is needed, a size of the notch 136 may be reduced, or the notch 136 may even be omitted. In this situation, a large force needs to be used to make the upper half of the first plate body 132 and the upper half of the second plate body 134 be close to or away from each other relatively.

On the contrary, if an elastic member 130 with a low elastic coefficient is needed, a designer may design a larger notch 136 in size. Certainly, in other embodiments, the designer may also adjust the elastic coefficient according to a different thickness or material of the elastic member 130, but is not limited thereto. In addition, a form of the elastic member 130 is not limited thereto. In other embodiments, the elastic member 130 may also be a spring, but is not limited thereto.

Because the elastic member 130 is flexible, when being inserted between the transistors 10 and the first wall 115a, the elastic member 130 is first pressed, and then the elastic member 130 restores and presses both the transistors 10 and the first wall 115a, so as to further press the transistors 10 against the second wall 115b. In this way, the heat emitted by the transistors 10 can be conducted to the second wall 115b, so as to achieve better heat dissipation.

On the other hand, because the elastic member 130 is flexible, even if transistors 10 have different thicknesses and sizes, the transistors 10 may also contact with the heat dissipation member 110 by pressing of the elastic member 130, and that the heat dissipation effect is achieved. Therefore, the transistor heat dissipation module 100 may be applied to different sizes of the transistors 10. Because different transistors 10 may adopt the transistor heat dissipation module 100, the embodiment provides with an assembly jig 20 (FIG. 5) corresponding to the transistor heat dissipation module 100 for the assembling the transistors 10 and the transistor heat dissipation module 100.

In the related art, different heat dissipation materials are correspondingly provided for different transistors, so that different assembly jigs are needed. In contrast, the use of the transistor heat dissipation module 100 can save considerable costs. Further, a defective rate, which may be caused by operational errors due to the fact that an operator is unfamiliar with operating manners of various assembly jigs, is also lowered.

In addition, in the related art, the transistors and the heat dissipation member need to be fixed by using screws, nuts, or gel. In contrast, in the transistor heat dissipation module 100, the elastic member 130 only needs to be inserted between the transistors 10 and the first wall 115a, and that the transistors 10 are secured, which is quite easy and convenient.

In the present embodiment, the elastic member 130 further includes a first stopping portion 133 connected to the first plate body 132 and a second stopping portion 135 connected to the second plate body 134. The first stopping portion 133 is in contact with a top of the first wall 115a, and the second stopping portion 135 is in contact with tops 12 of the transistors 10. That is, the first stopping portion 133 and the second stopping portion 135 are used to adjust a depth of insertion when the elastic member 130 is inserted into the heat dissipation member 110. In addition, because the tops 12 of the transistors 10 are pressed by the second stopping portion 135 and the transistors 10 are limited by the second stopping portion 135 to forbid the upward movement, the relative position may be secured.

Moreover, it can be seen from FIG. 3 that, in the present embodiment, because the number of the transistors 10 is two and the relative position between the two transistors 10 is fixed, the second plate body 134 of the elastic member 130 includes a protrusion part 137 extending between the two transistors 10. When an elastomer is assembled in the heat dissipation member 110, the protrusion part 137 extends between the two transistors 10, so that a short circuit is prevented when the two transistors 10 are excessively close to each other.

It should be noted that, in the present embodiment, each transistor 10 is, for example, a TO262 packaged in an uninsulated manner. The back of the TO262 is an aluminium heat dissipation material, and this part conducts electricity. Because the heat dissipation member 110 is, for example, a metal piece and may be grounded, the back portions of the transistors 10 cannot directly contact with the heat dissipation member 110 to avoid a short circuit. As can be seen from FIG. 2 and FIG. 3 that the transistor heat dissipation module 100 further includes an insulating layer 120 disposed on the second wall 115b and facing the transistors 10, and the transistors 10 are in contact with the insulating layer 120.

In the present embodiment, the insulating layer 120 is, for example, a film or a coating that is insulated but may conduct heat, and a material of the insulating layer 120 is, for example, a heat conductive adhesive layer or graphite and the like, but is not limited thereto. Because one side of each transistor 10 facing the second wall 115b may be metal, the insulating layer 120 disposed on the second wall 115b can effectively avoid a short circuit.

Certainly, in other embodiments, the second wall 115b may also be designed to exhibit insulating and heat conductive effects. In the present embodiment, the transistors 10 may be in direct contact with the second wall 115b, and the insulating layer 120 does not need to be disposed additionally.

In addition, in the present embodiment, the first connecting member 115c and the second connecting member 115d respectively include two inner wall surfaces 117, and the two inner wall surfaces 117 are in contact with side surfaces 16 of the two transistors 10 to limit positions of the two transistors 10. The first connecting member 115c and the second connecting member 115d further respectively include two concave portions 113 close to the second wall 115b and recessed in the two inner wall surfaces 117. The two concave portions 113 may retract to be isolated at a part of the two transistors 10 close to the second wall 115b (this part may be metal). Therefore, parts of the first connecting member 115c and the second connecting member 115d close to the second wall 115b do not directly contact with the two transistors 10 to avoid the short circuit.

Because pins 14 of the transistors 10 needs to correspond to a hole position on the circuit board (not shown), to have the transistors 10 be well located on the circuit board, the heat dissipation member 110 includes at least one bottom locating column 114 corresponding to the locating hole (not shown) on the circuit board. In the present embodiment, two extension portions 112 extend from two sides of the second wall 115b, and the two bottom locating columns 114 protrude downward from the two extension portions 112. Each transistor 10 includes a plurality of pins 14 protruding downward, and the pins 14 and the bottom locating columns 114 are adapted to be inserted into the hole position and the locating hole of the circuit board to be secured to the circuit board. In this way, the transistor heat dissipation module 100 and the transistors 10 disposed therein are secured to the circuit board as a whole.

Figure 5:
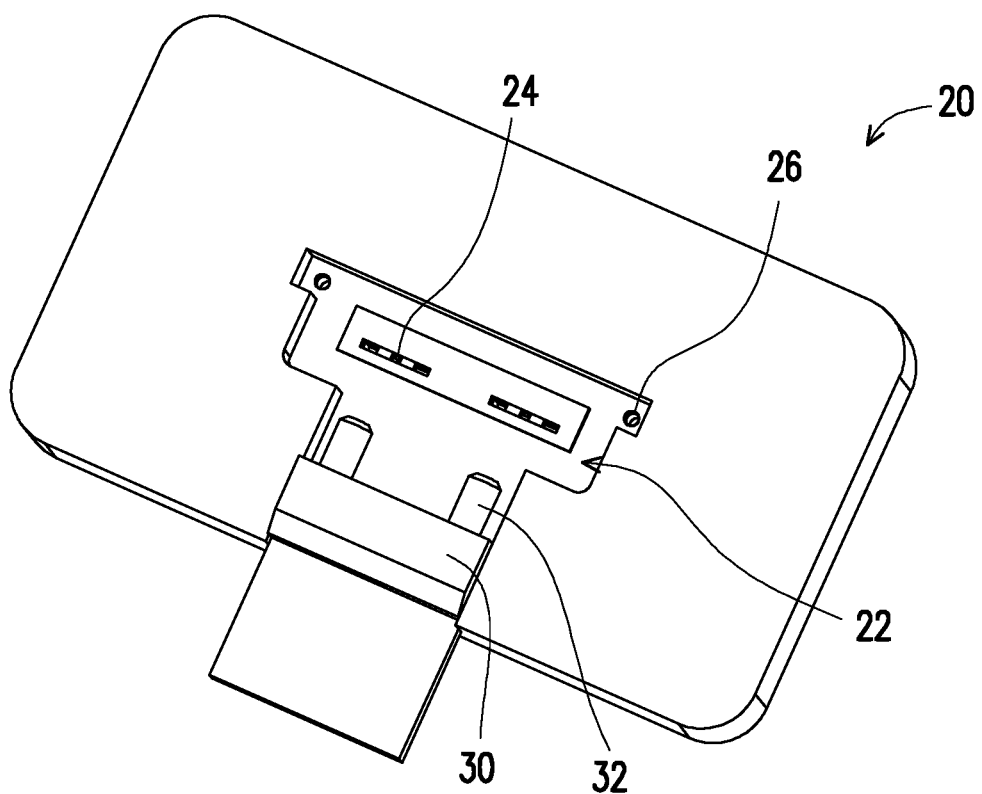
FIG. 5 is a schematic view of an assembly jig according to an embodiment of the disclosure.

An assembly method of the transistor heat dissipation module 100 is described below. FIG. 5 is a schematic view of an assembly jig according to an embodiment of the disclosure. FIG. 6A to FIG. 6E are schematic flow charts of assembling the transistor heat dissipation module shown in FIG. 1 onto the transistors.

Figure 6A:
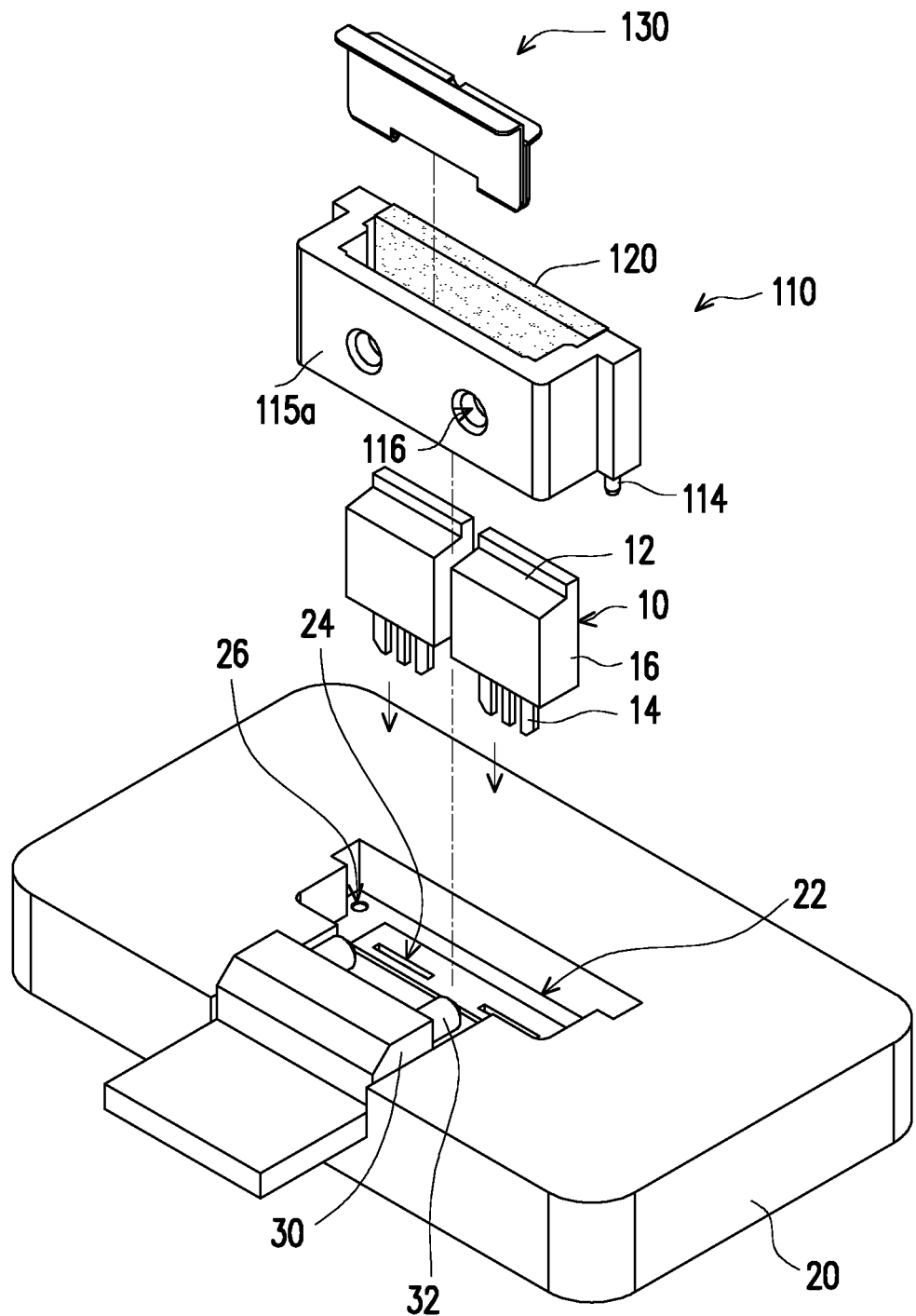
FIG. 6A to FIG. 6E are schematic flow charts of assembling the transistor heat dissipation module shown in FIG. 1 onto transistors.

Referring to FIG. 5 and FIG. 6A first, in the present embodiment, the transistor heat dissipation module 100 and the transistors 10 may be assembled by using the assembly jig 20, but is not limited thereto. In the present embodiment, the assembly jig 20 includes a groove 22, and a first locating hole 24 and a second locating hole 26 located in the groove 22.

Figure 6B:
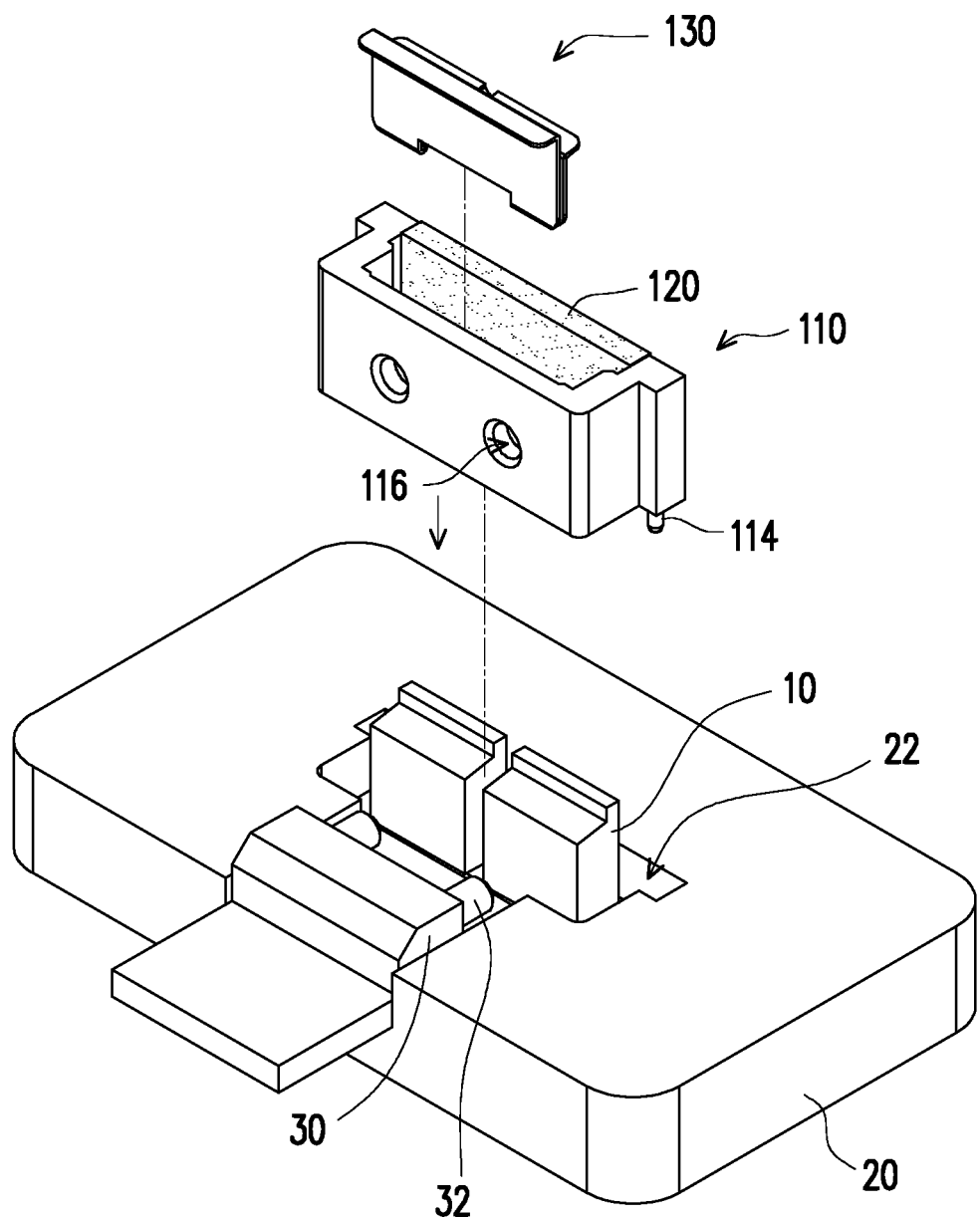

First, a manufacturer may, as shown in FIG. 6B, locate the transistors 10. Specifically, the transistors 10 may be arranged in the groove 22, and the pins 14 of the transistors 10 are located in the first locating hole 24 to complete locating.

Figure 6C:
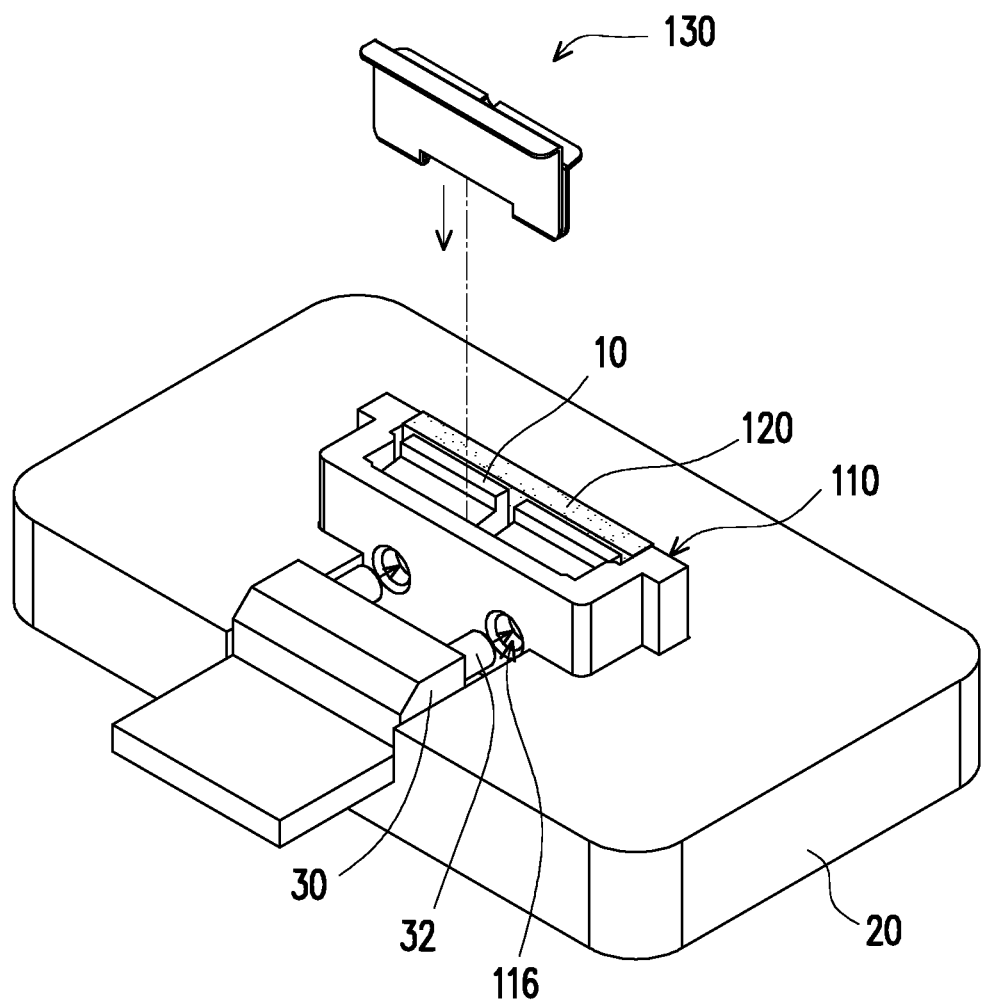

Next, as shown in FIG. 6C, the heat dissipation member 110 is located. For example, the heat dissipation member 110 is arranged in the groove 22, and the bottom locating column 114 of the heat dissipation member 110 is located in the second locating hole 26. The heat dissipation member 110 at least partially surrounds the transistors 10. The transistors 10 and the heat dissipation member 110 may be automatically assembled by using a mechanical arm or manually assembled. The assembly manner is not limited.

In the present embodiment, the heat dissipation member 110 includes the first wall 115a, the second wall 115b, the first connecting member 115c, and the second connecting member 115d that are presented as a ring. Therefore, the heat dissipation member 110 completely surrounds a periphery of the transistors 10. In other embodiments, the heat dissipation member 110 may also be located at two sides of the transistors 10 only, and is not limited by the drawings.

Figure 6D:
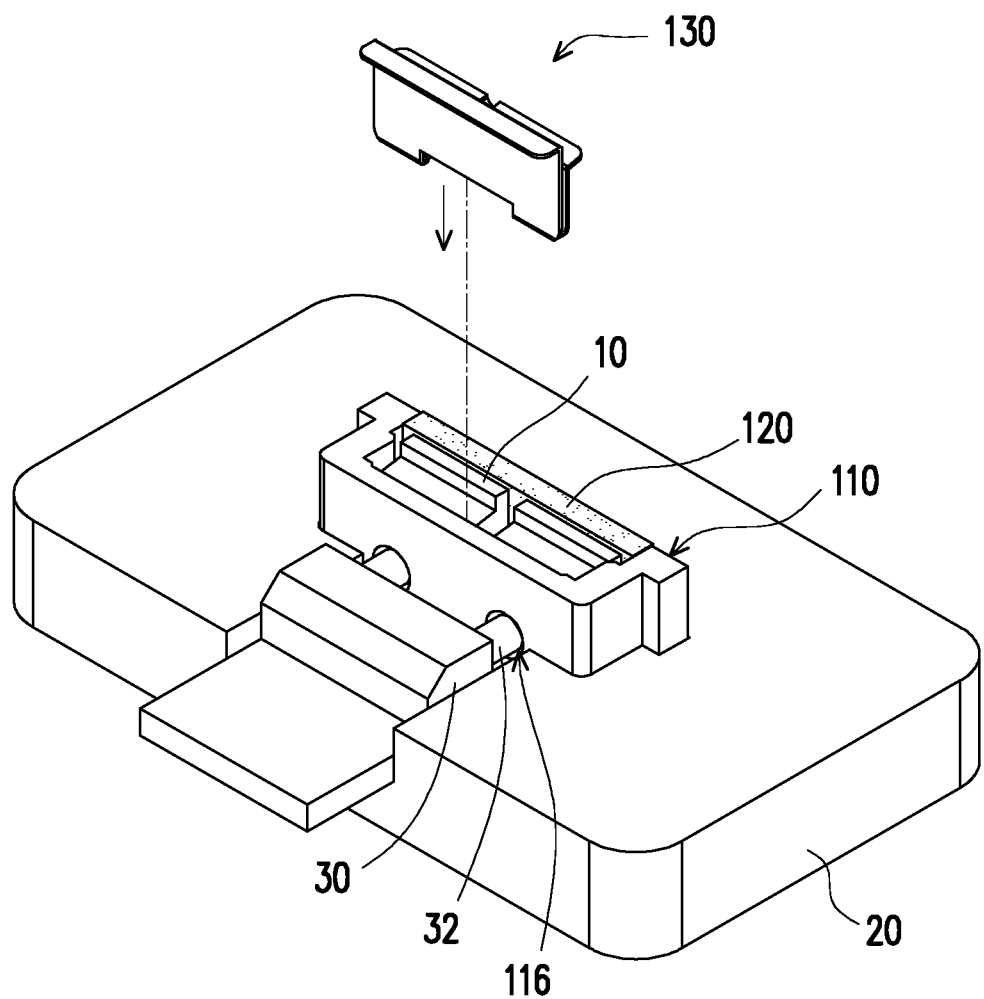

As shown in FIG. 6C to FIG. 6D, the first wall 115a of the heat dissipation member 110 includes a through hole 116 corresponding to the transistors 10, and the assembly jig 20 includes a fixed seat 30 and a telescopic rod 32 that may be telescopic from the fixed seat 30 and be aligned with the through hole 116. After the transistors 10 and the heat dissipation member 110 are located, the telescopic rod 32 extends into the through hole 116 to push the transistors 10 to the second wall 115b to form a space between the transistors 10 and the first wall 115a.

Figure 6E:
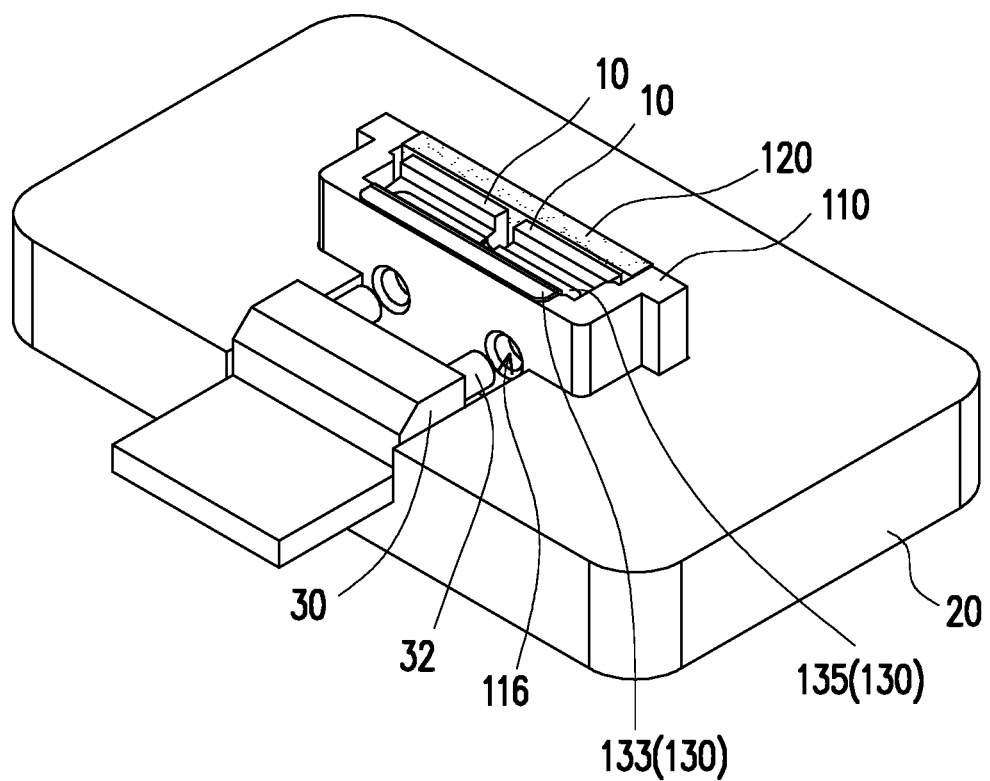

Finally, as shown in FIG. 6E, an elastic member 130 is arranged in the accommodating space 111 of the heat dissipation member 110, and is located between the transistors 10 and the first wall 115a to make the transistors 10 abut against the second wall 115b. Similarly, the elastic member 130 may be assembled by using a mechanical arm in a magnetic manner or manually assembled. The assembly manner is not limited.

In the step of arranging the elastic member 130, the telescopic rod 32 retracts and leaves away from the through hole 116, so that the elastic member 130 may enter the accommodating space 111. In addition, in this step, the elastic member 130 is inserted into the accommodating space 111 until the first stopping portion 133 is in contact with the top of the first wall 115a and the second stopping portion 135 is in contact with the tops 12 of the transistors 10.

The transistor heat dissipation module 100 of the present embodiment may be applied to different sizes of transistors 10. Therefore, the assembly jig 20 corresponding to the transistor heat dissipation module 100 may be used for assembling different transistors 10 with the same transistor heat dissipation module 100. In the related art, various transistors have corresponding heat dissipation members, and the heat dissipation members also have corresponding assembly jigs. Accordingly, various assembly jigs need to be purchased, and operators need to be trained to be familiar with all the assembly jigs, which consumes considerable costs. In the present embodiment, the transistor heat dissipation module 100 can only be assembled by using one assembly jig 20, and costs are thereby significantly lowered.

Figure 7:
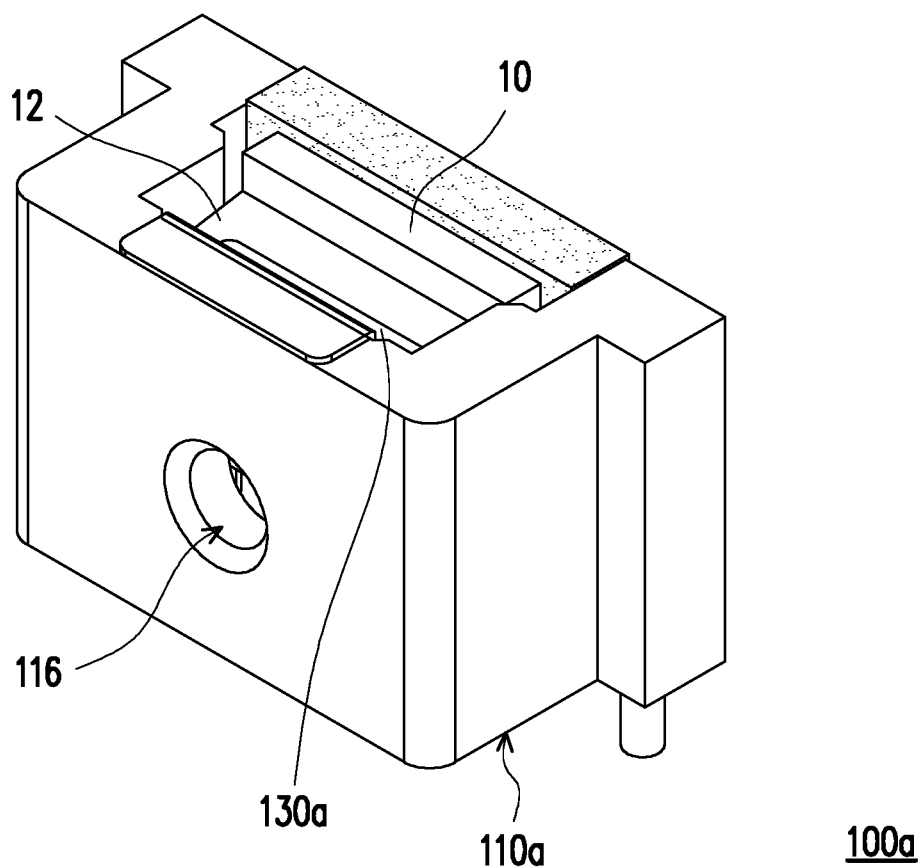
FIG. 7 is a schematic view of a transistor heat dissipation module and a transistor according to another embodiment of the disclosure.

FIG. 7 is a schematic view of a transistor heat dissipation module and a transistor according to another embodiment of the disclosure. Referring to FIG. 7, a main difference between a transistor heat dissipation module 100a in FIG. 7 and the transistor heat dissipation module 100 in FIG. 1 is that the transistor heat dissipation module 100a of the embodiment in FIG. 7 is mainly applied to a single transistor 10, and a size of a heat dissipation member 110a can be correspondingly small. Similarly, a size of an elastic member 130a can be correspondingly reduced.

Based on the above, regarding the transistor heat dissipation module of the disclosure, the transistors and the elastic member may be accommodated in the accommodating space of the heat dissipation member, and the elastic member may press the transistors against the second wall of the heat dissipation member, so that heat emitted by the transistor can be dissipated to the heat dissipation member. Because the elastic member is flexible, even if the sizes of the transistors are different, the transistors may contact with the heat dissipation member as being pressed by the elastic member, and the heat dissipation effect is thereby achieved. Therefore, the transistor heat dissipation module of the disclosure may be applied to transistors in different sizes. In addition, since different transistors may adopt the same transistor heat dissipation module, compared with the related art in which various heat dissipation members are needed and thereby different assembly processes are provided, only one assembly manner of the present embodiment may be necessary for the transistor heat dissipation module and different transistors. Therefore, considerable costs may be saved, and a defective rate arising from operational errors may also be lowered.

What is claimed is:

1. A transistor heat dissipation module, adapted for at least one transistor, the transistor heat dissipation module comprising:
a heat dissipation member, comprising a first wall and a second wall opposite to each other and a first connecting member connected to the first wall and the second wall, wherein an accommodating space is formed between the first wall and the second wall, and the at least one transistor is adapted to be disposed in the accommodating space, wherein the first wall comprises at least one through hole corresponding to the at least one transistor; and
an elastic member, disposed in the accommodating space and located between the at least one transistor and the first wall to press the at least one transistor against the second wall.

2. The transistor heat dissipation module according to claim 1, wherein the heat dissipation member further comprises a second connecting member, connected to the first wall and the second wall and opposite to the first connecting member, and the first wall, the second wall, the first connecting member, and the second connecting member surround and define the accommodating space together.

3. The transistor heat dissipation module according to claim 1, wherein the first connecting member comprises an inner wall surface, the inner wall surface is in contact with the at least one transistor, and the first connecting member comprises a concave portion close to the second wall and recessed in the inner wall surface to be isolated from the at least one transistor.

4. The transistor heat dissipation module according to claim 1, wherein the heat dissipation member further comprises a bottom locating column, adapted to be inserted into a locating hole of a circuit board.

5. The transistor heat dissipation module according to claim 1, further comprising an insulating layer, disposed on the second wall and facing the at least one transistor, wherein the at least one transistor is in contact with the insulating layer.

6. The transistor heat dissipation module according to claim 1, wherein the second wall is insulated, and the at least one transistor is in contact with the second wall.

7. The transistor heat dissipation module according to claim 1, wherein the elastic member comprises a first plate body and a second plate body connected at a bottom, so that the elastic member is V-shaped or U-shaped, and the bottom of the elastic member comprises a notch.

8. The transistor heat dissipation module according to claim 7, wherein the elastic member further comprises a first stopping portion connected to the first plate body and a second stopping portion connected to the second plate body, the first stopping portion is in contact with a top of the first wall, and the second stopping portion is in contact with a top of the at least one transistor.

9. The transistor heat dissipation module according to claim 7, wherein the at least one transistor comprises two transistors, and the second plate body faces the two transistors and comprises a protrusion part extending between the two transistors.

10. An assembly method of a transistor heat dissipation module, comprising:
- providing an assembly jig, wherein the assembly jig comprises a first locating hole and a second locating hole;
- locating a transistor, wherein the transistor is located in the first locating hole;
- locating a heat dissipation member, to at least partially surround the transistor, wherein the heat dissipation member comprises a first wall and a second wall opposite to each other and a first connecting member connected to the first wall and the second wall, an accommodating space is formed between the first wall and the second wall, and the transistor is located in the accommodating space of the heat dissipation member, wherein the heat dissipation member is located in the second locating hole; and
- arranging an elastic member, arranged in the accommodating space and located between the transistor and the first wall, to make the transistor abut against the second wall.

11. The assembly method of the transistor heat dissipation module according to claim 10, wherein the first wall comprises a through hole corresponding to the transistor, the assembly jig comprises a telescopic rod located in the through hole, the telescopic rod extends into the through hole to push the transistor to the second wall after the transistor and the heat dissipation member are located to form a space between the transistor and the first wall, and the telescopic rod retracts to leave away from the through hole in the step of arranging the elastic member.

12. The assembly method of the transistor heat dissipation module according to claim 11, wherein the elastic member comprises a first stopping portion and a second stopping portion, and the elastic member is inserted into the accommodating space until the first stopping portion is in contact with a top of the first wall and the second stopping portion is in contact with a top of the transistor in the step of arranging the elastic member.

* * * * *